United States Patent
Kakimoto et al.

(10) Patent No.: US 12,482,663 B2
(45) Date of Patent: *Nov. 25, 2025

(54) PROCESSING APPARATUS

(71) Applicant: Tokyo Electron Limited, Tokyo (JP)

(72) Inventors: Akinobu Kakimoto, Yamanashi (JP); Yoshinobu Hayakawa, Miyagi (JP); Satoshi Mizunaga, Iwate (JP); Yasuhiro Hamada, Yamanashi (JP); Mitsuhiro Okada, Hwaseong-si (KR)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/902,918

(22) Filed: Sep. 5, 2022

(65) Prior Publication Data

US 2022/0415660 A1 Dec. 29, 2022

Related U.S. Application Data

(63) Continuation of application No. 16/596,056, filed on Oct. 8, 2019, now abandoned, which is a continuation
(Continued)

(30) Foreign Application Priority Data

Jun. 16, 2014 (JP) .................................. 2014-123164
Oct. 2, 2014 (JP) .................................. 2014-203619

(51) Int. Cl.
*H01L 21/3065* (2006.01)
*C23C 16/52* (2006.01)
(Continued)

(52) U.S. Cl.
CPC .......... *H01L 21/3065* (2013.01); *C23C 16/52* (2013.01); *C23C 16/54* (2013.01);
(Continued)

(58) Field of Classification Search
None
See application file for complete search history.

(56) References Cited

U.S. PATENT DOCUMENTS

| 4,994,404 A | 2/1991 | Sheng et al. |
| 5,880,019 A | 3/1999 | Hsieh et al. |

(Continued)

FOREIGN PATENT DOCUMENTS

| JP | H03273626 A | 12/1991 |
| JP | 8-250466 A | 9/1996 |

(Continued)

OTHER PUBLICATIONS

Japanese Office Action issued Jul. 4, 2022, in corresponding Japanese Patent Application No. 2021-143535, 12 pp.

*Primary Examiner* — Karla A Moore
(74) *Attorney, Agent, or Firm* — XSENSUS LLP (57) ABSTRACT

A processing apparatus includes a first chamber having a gas first inlet and a first gas outlet, a plasma generator that generates a plasma in the first chamber, and a second chamber having a second gas inlet and a second gas outlet. A control unit controls the first inlet to provide a carbon containing gas to the first chamber and control the plasma generator to apply a first plasma to a silicon-containing film of a substrate to a first depth. The control unit controls the second gas inlet to apply another gas inside the second chamber and deposit a second part of the protection film over the first part of the protection film. The control unit controls a supply of a fluorocarbon gas through the first gas inlet and control the plasma generator to generate a second plasma to etch the silicon-containing film to a second depth.

20 Claims, 10 Drawing Sheets

Related U.S. Application Data of application No. 15/310,840, filed as application No. PCT/JP2015/066114 on Jun. 3, 2015, now Pat. No. 10,460,950.

(51) Int. Cl.

| | |
|---|---|
| *C23C 16/54* | (2006.01) |
| *H01J 37/32* | (2006.01) |
| *H01L 21/308* | (2006.01) |
| *H01L 21/311* | (2006.01) |
| *H01L 21/67* | (2006.01) |

(52) U.S. Cl.
CPC .. *H01J 37/32009* (2013.01); *H01J 37/32082* (2013.01); *H01J 37/32899* (2013.01); *H01L 21/308* (2013.01); *H01L 21/31116* (2013.01); *H01L 21/31144* (2013.01); *H01L 21/67276* (2013.01); *H01J 2237/334* (2013.01); *H01L 21/3081* (2013.01); *H01L 21/3083* (2013.01)

(56) References Cited

U.S. PATENT DOCUMENTS

| | | |
|---|---|---|
| 7,122,477 B2 | 10/2006 | Ikeda |
| 7,141,504 B1 | 11/2006 | Bhardwaj |
| 8,323,451 B2* | 12/2012 | Ngai .................. H01L 21/0338 |
| | | 118/721 |
| 8,993,449 B2 | 3/2015 | Morikawa et al. |
| 10,460,950 B2 | 10/2019 | Kakimoto et al. |
| 11,670,516 B2* | 6/2023 | Colinjivadi ....... H01L 21/68785 |
| | | 438/778 |
| 2003/0173333 A1 | 9/2003 | Wang et al. |
| 2004/0097077 A1* | 5/2004 | Nallan .............. H01L 21/30655 |
| | | 438/689 |
| 2005/0035460 A1* | 2/2005 | Tseng .................... H01L 23/485 |
| | | 257/E21.585 |
| 2005/0136682 A1* | 6/2005 | Hudson ............. H01L 21/31116 |
| | | 438/714 |
| 2006/0264054 A1 | 11/2006 | Gutsche et al. |
| 2007/0026677 A1* | 2/2007 | Ji ........................ H01L 21/0337 |
| | | 438/689 |
| 2007/0228006 A1* | 10/2007 | Kitamura .......... H01L 21/76802 |
| | | 156/345.23 |
| 2008/0023441 A1 | 1/2008 | Tsai |
| 2009/0087960 A1* | 4/2009 | Cho .................... H10D 64/517 |
| | | 438/719 |
| 2009/0275202 A1* | 11/2009 | Tanaka .............. H01L 21/30655 |
| | | 700/121 |
| 2012/0171869 A1 | 7/2012 | Morikawa et al. |
| 2012/0322268 A1 | 12/2012 | Kim et al. |
| 2013/0105303 A1 | 5/2013 | Lubomirsky et al. |
| 2014/0087562 A1* | 3/2014 | Ikarashi .................. H01J 37/12 |
| | | 438/697 |
| 2014/0134846 A1* | 5/2014 | Hirayama ......... H01L 21/31138 |
| | | 438/703 |
| 2020/0035496 A1 | 1/2020 | Kakimoto et al. |
| 2020/0035497 A1 | 1/2020 | Kakimoto et al. |

FOREIGN PATENT DOCUMENTS

| | | |
|---|---|---|
| JP | 10-261713 A | 9/1998 |
| JP | 2001-332602 A | 11/2001 |
| JP | 2002-313776 A | 10/2002 |
| JP | 2003-133293 A | 5/2003 |
| JP | 2004-335526 A | 11/2004 |
| JP | 2006-523030 A | 10/2006 |
| JP | 2007-180493 A | 7/2007 |
| JP | 2008-41723 A | 2/2008 |
| JP | 2008-60566 A | 3/2008 |
| JP | 2008-126373 A | 6/2008 |
| JP | 2008-126374 A | 6/2008 |
| JP | 2008-521261 A | 6/2008 |
| JP | 2009-088522 A | 4/2009 |
| JP | 2009-170751 A | 7/2009 |
| JP | 2010-21184 A | 1/2010 |
| JP | 2010-171372 A | 8/2010 |
| JP | 2012-174891 A | 9/2012 |
| JP | 2012-233259 A | 11/2012 |
| JP | 2013-21192 A | 1/2013 |
| JP | 2014-3085 A | 1/2014 |
| JP | 2014-17438 A | 1/2014 |
| JP | 2014-33186 A | 2/2014 |
| JP | 2014-063866 A | 4/2014 |
| KR | 10-2004-0033309 A | 4/2004 |
| KR | 2009-0071479 A | 7/2009 |
| KR | 10-1330650 B1 | 11/2013 |
| TW | 200710988 A | 3/2007 |
| TW | 201324613 A | 6/2013 |
| TW | 201403707 A | 1/2014 |
| TW | 201417181 A | 5/2014 |
| WO | 2011/018900 A1 | 2/2011 |
| WO | 2014/046083 A1 | 3/2014 |

\* cited by examiner

| PROCESS | CASE 1 | CASE 2 | CASE 3 | CASE 4 |
|---|---|---|---|---|
| | HALF ETCHING (200 S)<br>⇒ ASHING | FULL ETCHING (350 S)<br>⇒ ASHING | HALF ETCHING (200 S)<br>⇒ ASHING<br>⇒ CARBON FILM (1 nm)<br>⇒ FULL ETCHING (150 S)<br>⇒ ASHING | HALF ETCHING (200 S)<br>⇒ ASHING<br>⇒ CARBON FILM (2 nm)<br>⇒ FULL ETCHING (150 S)<br>⇒ ASHING |
| TOP CD | 48.9 nm | 55.6 nm | 52.9 nm | 54.2 nm |
| BOWING CD | — | 65.6 nm | 58.2 nm | 57.5 nm |

FIG.9

| PROTECTION FILM | N/A | | CARBON FILM HALF ETCHING → FILM FORMING → FULL ETCHING | | SILICON FILM |
|---|---|---|---|---|---|
| | HALF ETCHING | FULL ETCHING | | | |
| PROTECTION FILM thickness | none | none | (C) 2 nm | (C) 3 nm | (Si) 3 nm |
| Depth | 517 nm | 750 nm | 739 nm | 729 nm | 749 nm |
| BOWING CD | 28.8 | 30.4 | 29.2 | 27.6 | 29.2 |
| | DIFFERENCE | | −1.2 nm | −2.8 nm | −1.2 nm |

PROCESSING APPARATUS

CROSS-REFERENCE TO RELATED APPLICATIONS

The present application is a continuation application of U.S. patent application Ser. No. 16/596,056 filed on Oct. 8, 2019, which is a continuation application of U.S. patent application Ser. No. 15/310,840 filed on Nov. 14, 2016, which is the National stage of International Application No. PCT/JP2015/066114 filed on Jun. 3, 2015, claiming priority based on Japanese Priority Application No. 2014-123164 filed on Jun. 16, 2014, and Japanese Priority Application No. 2014-203619 filed on Oct. 2, 2014, the entire contents of which are hereby incorporated herein by reference.

TECHNICAL FIELD

The present invention relates to substrate processing systems and substrate processing methods.

BACKGROUND ART

In plasma etching of contact hole having high aspect ratio, it is difficult for ion to reach a bottom of the contact hole as a depth of the hole becomes greater. Therefore, not only the bottom of the contact hole but also the side wall thereof is etched. Consequently, a bowing shape is formed, in which a diameter (referred to as Critical Dimension (CD) value) at upper side of the hole is greater than the CD at lower side of the hole. Hence, a technology is proposed, in which a desired film is formed on a side wall of a pattern after the etching of the hole is completed so as to repair a form of the pattern (e.g., Patent Document 1).

CITATION LIST

Patent Document

[Patent Document 1]: Japanese Laid-open Patent Publication No. 2014-17438

SUMMARY OF INVENTION

Technical Problem

However, in a case where the film is formed after the etching of the hole is completed, an etching rate may decrease as the depth of the hole becomes greater because of the decrease in the number of ions in the plasma that reaches the bottom of the hole. Consequently, the aspect ratio becomes low, and desired characteristic of a semiconductor device may not be achieved.

An object of an aspect of present invention is to perform a favorable etching process while the formation of the bowing shape is suppressed.

Solution to Problems

According to an embodiment of the present invention, there is provided a substrate processing system including an etching apparatus configured to supply a gas containing fluorocarbon to generate plasma so as to perform an etching process on a film including silicon formed on a substrate, wherein the etching process is performed by using plasma through a mask formed on the film including silicon; a film forming apparatus configured to supply a gas containing carbon so as to form a film including carbon on the etched film including silicon, wherein the film forming apparatus is provided separately from the etching apparatus, the etching apparatus performing, a first etching step in which the film including silicon is partway etched by using plasma; and a second etching step in which the film including silicon, on which the film including carbon is formed, is further etched by using plasma, the film forming apparatus performing a film forming step in which the film including carbon is formed, without generating plasma, on the film including silicon on which the first etching step has been performed.

Advantageous Effects of Invention

According to an aspect of the present invention, it is possible to perform a favorable etching process while the formation of the bowing shape is suppressed.

DESCRIPTION OF EMBODIMENTS

Herein below, embodiments of the present invention will be described with reference to the accompanying drawings. Additionally, in the present specification and drawings, identical reference numerals will be applied to elements or the like that have substantially similar functions and configurations to those in another embodiment, and descriptions thereof may be omitted.

<Example Configuration of Substrate Processing System>

Figure 1:
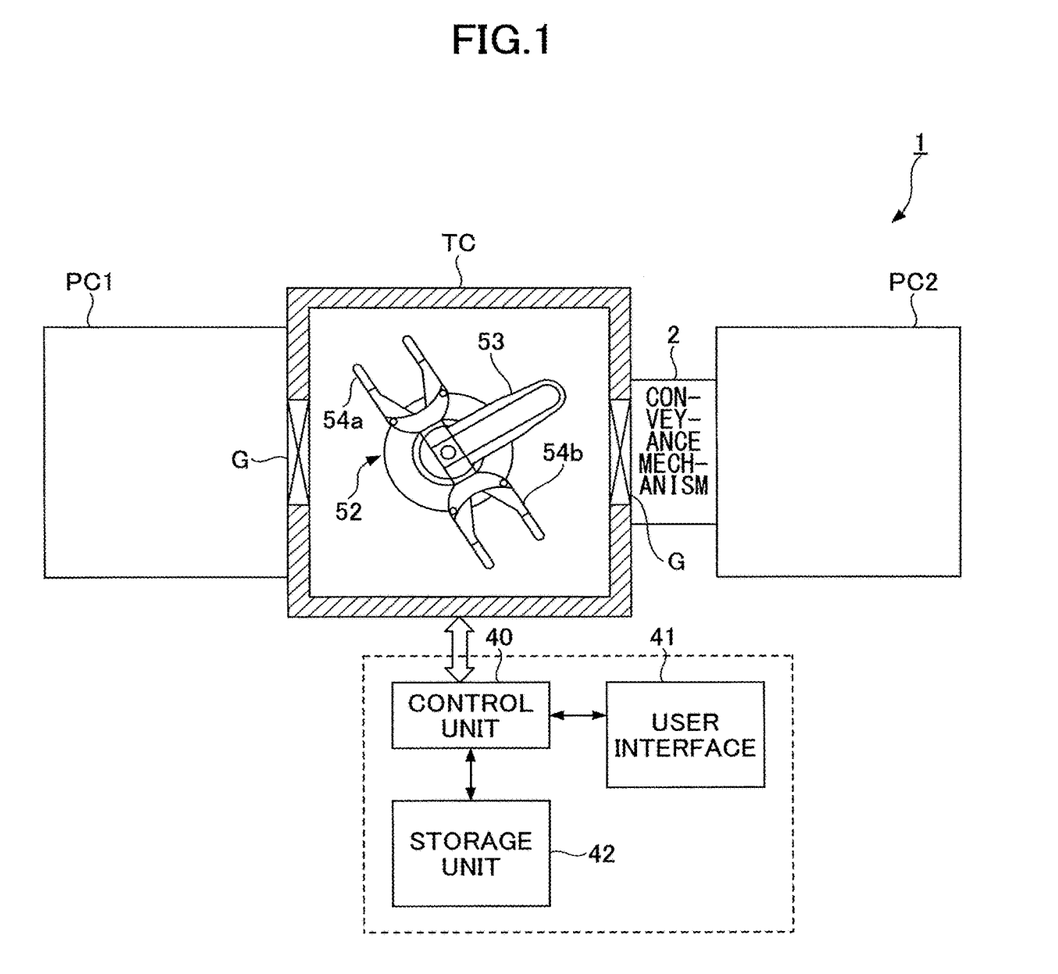
FIG. 1 is an example configuration of the substrate processing system.

First, an example configuration of a substrate processing system 1 of an embodiment of the present invention will be described with reference to FIG. 1. FIG. 1 is an example configuration of the substrate processing system 1 of the present embodiment. The substrate processing system 1 includes a process chamber (hereinafter simply referred to as "PC") PC1 that processes a substrate in-situ and a process chamber PC2 that processes a substrate ex-situ. The PC1 and the PC2 are separately provided as discrete chambers.

The PC1 and the PC2 are connected via a transfer chamber (hereinafter referred to as "TC") and a conveyance mechanism 2. The PC1 and the TC, and the TC and the conveyance mechanism 2 are connected via a gate valve G so that the connection is open/close by the gate valve G. The interiors of the PC1 and TC are in a reduced pressure state. By carrying in and carrying out the substrate by opening and closing the gate valve G, the inside of the PC1 is isolated from outside air to keep a predetermined vacuum degree.

A conveyance apparatus 52 for holding and carrying in/out the substrate is provided in the TC. The conveyance apparatus 52 includes a rotation/expansion and contraction unit 53 that is rotatable and able to be expanded and contracted and two blades 54a and 54b that hold the substrate at the front end of the rotation/expansion and contraction unit 53. The blades 54a and 54b are mounted on the rotation/expansion and contraction unit 53 so that respective blades face opposite sides.

The conveyance mechanism 2 conveys the substrate between the TC and the PC2. For example, the conveyance mechanism 2 may be configured so that the conveyance mechanism 2 runs on a rail with holding the substrate on a tray disposed in the conveyance mechanism 2.

The PC1 generates plasma, and serves as an etching apparatus for performing etching process on a film formed on the substrate by using the plasma. The PC1 may serve as an ashing apparatus for performing ashing process on the film formed on the substrate by using plasma.

PC2 is a film forming apparatus for forming a film on the substrate without using plasma. In the present embodiment, the PC2 serves as a thermal CVD (Chemical Vapor Deposition) apparatus for forming a carbon film on the substrate by using heat. However, the thermal CVD apparatus is not a limiting example of the PC2. Any types of apparatus may be chosen as long as the apparatus can uniformly form a film inside (at least side wall of) a pattern on the substrate etched by the PC1.

The substrate processing system 1 includes a control unit 40 for controlling an etching process, a film forming process, and an ashing process of the substrate and a conveyance process of the substrate. Control programs for performing the etching process, the film forming process, the ashing process, and the conveyance process, and processing recipe in which respective processing conditions are set are stored in a storage unit 42. The storage unit 42 may be a hard disk, or may be a portable recording medium such as a CDROM (Compact Disc Read Only Memory), a DVD (Digital Versatile Disk), and a flash memory. Also, for example, the processing recipe may be transmitted from another apparatus through a dedicated line if needed.

For example, the control unit 40 performs the etching process, the film forming process, the ashing process, and the conveyance process, etc., according to the processing recipe stored in the storage unit 42 in response to user's instruction input through a user interface 41.

<Example Configuration of PC1/PC2>
<PC1: Etching Apparatus>

Figure 2:
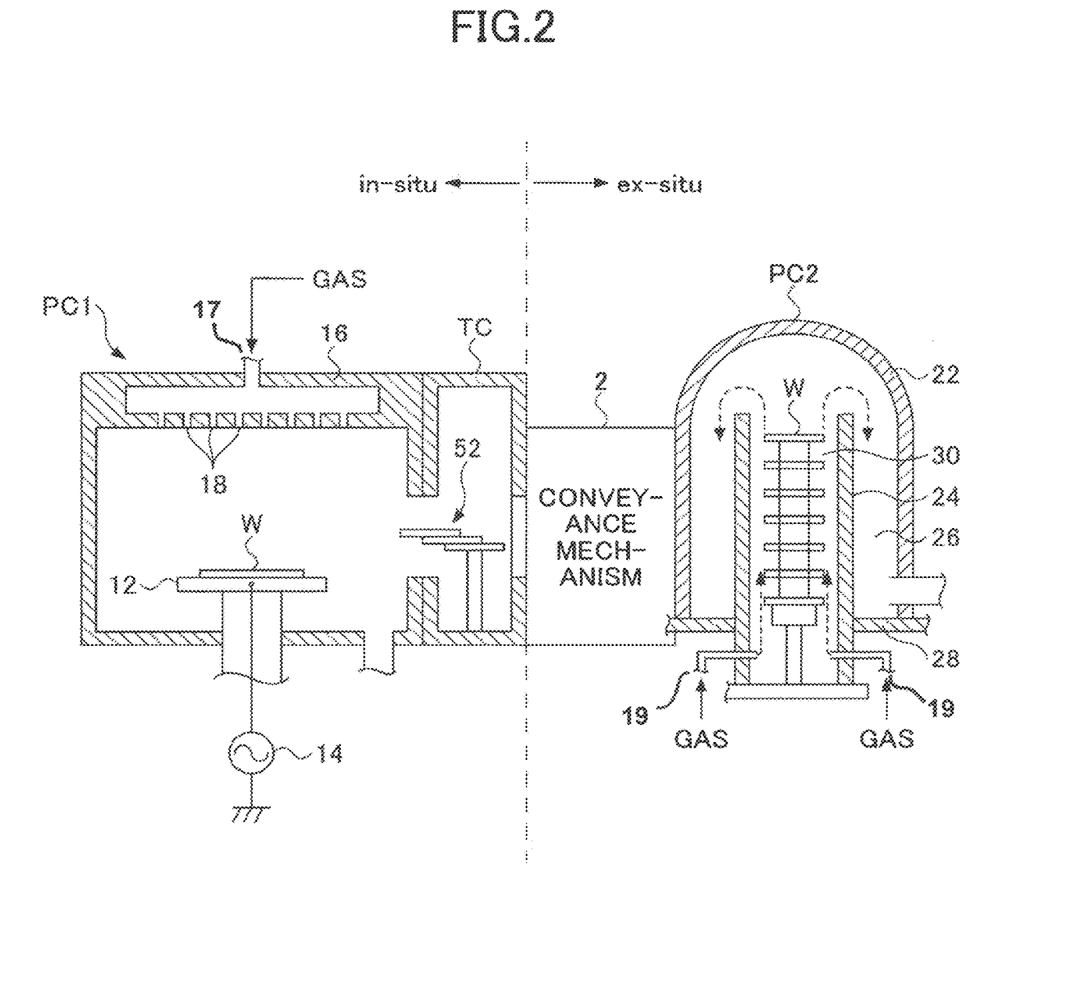
FIG. 2 is a longitudinal cross sectional view of the substrate processing system 1 (including PC1 and PC2).

An example configuration of the PC1 and the PC2 of the present embodiment is briefly described with reference to FIG. 2. FIG. 2 is a longitudinal cross sectional view of the substrate processing system 1 (including PC1 and PC2) of the present embodiment. However, FIG. 2 illustrates a non-limiting example configuration of PC1 and PC2. For example, the PC1 is exemplified as a Capacitively Coupled Plasma (CCP) processing apparatus. However, the configuration of PC1 may be applied to other substrate processing apparatuses. An Inductively Coupled Plasma (ICP) processing apparatus, a CVD (Chemical Vapor Deposition) apparatus using a radial line slot antenna, a Helicon Wave Plasma (HWP) processing apparatus, and an Electron Cyclotron Resonance Plasma (ECR) processing apparatus may be included in the other substrate processing apparatuses.

The PC1 and the TC perform the process and conveyance of the substrate under a reduced pressure while the conveyance mechanism 2 and the PC2 perform the process and conveyance of the substrate under an atmospheric pressure.

The PC1 includes processing chamber made of aluminum, etc., having an anodized surface. A mounting table 12 for mounting the substrate W is disposed inside the PC1. A high frequency power supply 14 is connected to the mounting table 12, and high frequency power at a predetermined frequency (e.g. 60 MHz) for generating plasma is supplied from the high frequency power supply 14. As seen in FIG. 2, the PC1 includes a gas inlet 17 (first gas inlet).

A shower head 16 is disposed at a ceiling of the PC1. Gas is supplied in shower-like form from a plurality of gas supply holes 18 formed at lower portion of the shower head 16. In the present embodiment, a gas containing fluorocarbon is supplied, and a film including silicon formed on the substrate is etched by the generated plasma.

An etching gas may be a single gas of fluorocarbon (CF) gas, or may be a mixed gas containing fluorocarbon gas. The etching gas may include hexafluoro-1,3-butadiene $C_4F_6$ gas as the gas containing fluorocarbon.

After the film including silicon formed on the substrate W is etched in the PC1, the substrate W is carried into the PC2 by using the conveyance apparatus 52 of the TC and the conveyance mechanism 2.

<PC2: Thermal CVD Apparatus>

The PC2 includes a cylindrical outer wall 22 having a ceiling and an inner wall 24 provided inside the outer wall 22. For example, the outer wall 22 and the inner wall 24 are made of quartz. A plurality of substrates W are stored in a processing chamber 30 inside the inner wall 24. The PC2 performs a film forming process collectively on a plurality of substrates W. The outer wall 22 and the inner wall 24 are separated from each other having a circular space 26 there between, and coupled to a base member 28 at respective lower ends. As seen in FIG. 2, the PC2 includes gas inlets 19 (second gas inlet/inlets).

In the present embodiment, a gas containing carbon (C) is supplied as a film forming gas. The supplied gas containing carbon flows from lower side to upper side of the processing chamber 30 being sucked by the circular space 26 to be exhausted.

The film forming gas may be a single gas containing carbon, or may be a mixed gas including the gas containing carbon. The film forming gas may include ethylene ($C_2H_4$) gas or other carbon ($C_xH_y$) gas as the gas containing carbon. The film forming gas may include chlorine ($Cl_2$) gas as a thermal decomposition temperature decreasing gas. Also, the film forming gas may include an inactive gas such as nitrogen ($N_2$) gas. The PC2 thermally decomposes the film forming gas to form a film including carbon on the film including silicon formed on the substrate. The PC2 may be a single-wafer film forming apparatus.

Hereinabove, an example configuration of the PC1 and the PC2 is described. According to the substrate processing system 1 of the present embodiment, firstly, the substrate W is carried into the PC1 and the etching process is performed by the PC1. Then, the substrate W is carried into the PC2, and carbon film forming process is performed by the PC2. Further, the substrate is carried into the PC1, and the etching process is performed again by the PC1. Finally, the carbon film is removed by the PC1.

<Bowing Shape>

Figure 3A:
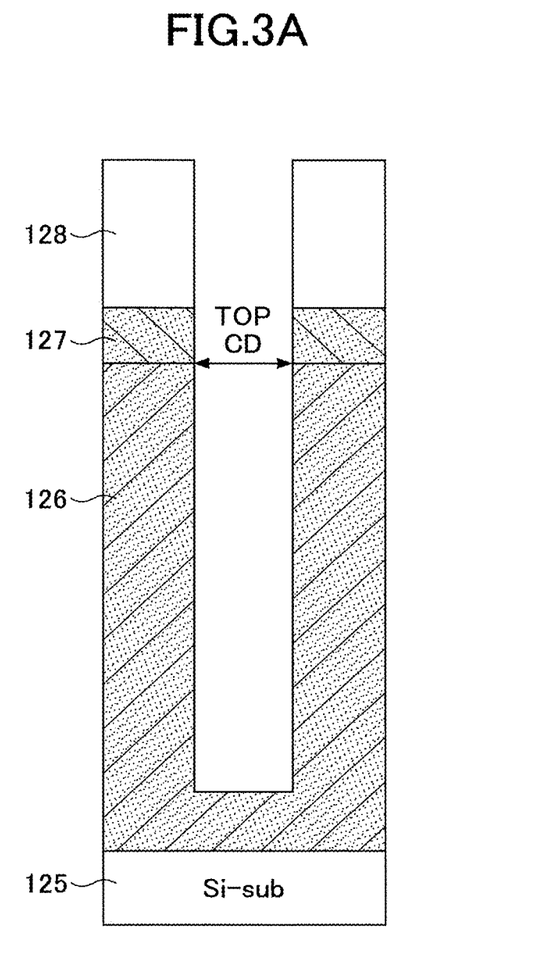
FIG. 3A is a diagram illustrating a bowing shape.
Figure 3B:
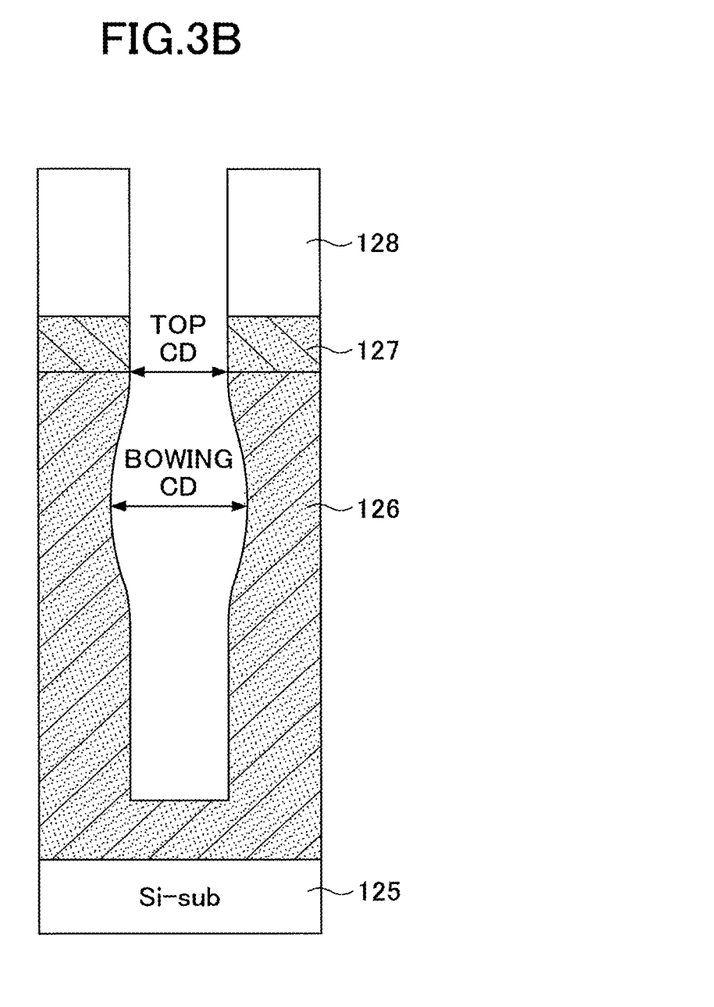
FIG. 3B is another diagram illustrating the bowing shape.

In the following, the bowing shape formed in an etching pattern will be described with reference to FIG. 3A and FIG. 3B. As illustrated in FIG. 3A, on the silicon substrate 125, a silicon oxide ($SiO_2$) film 126, a silicon nitride (SiN) film 127, and a polysilicon mask 128 are formed.

In the present embodiment, the silicon oxide ($SiO_2$) film is exemplified as a film including silicon that is an etching object film. However, this is not a limiting example of the film including silicon that is the etching object film. A silicon-containing oxide ($SiO_x$) film, silicon nitride (SiN) film, or laminated film of the silicon-containing oxide film and the silicon nitride film may be used. The mask may be an amorphous carbon mask, or a metal-containing mask.

A hole-shaped or line-shaped pattern as desired is formed on the polysilicon mask 128. In a case where the silicon oxide film 126 is etched into a desired shape such as hole-shape, amount of radical in plasma reaching a bottom of the hole decreases as the depth of the etched hole becomes greater. Therefore, not only the bottom of a contact hole but also side portion thereof is etched. Consequently, as illustrated in FIG. 3B, the bowing shape is formed, in which bowing CD at a lower portion of the hole becomes greater than a top CD at upper portion of the hole. In a case where the etching pattern is in a bowing shape, favorable device characteristics are unlikely to be obtained in comparison to a case where the etching pattern is in a vertical shape as illustrated in FIG. 3A.

Therefore, the substrate processing system 1 of the present embodiment performs a substrate processing method, in which the formation of the bowing shape is suppressed while favorable etching process can be performed. In the following, the substrate processing method performed by the substrate processing system 1 of the present embodiment will be described with reference to FIG. 4.

<Substrate Processing Method>

Figure 4:
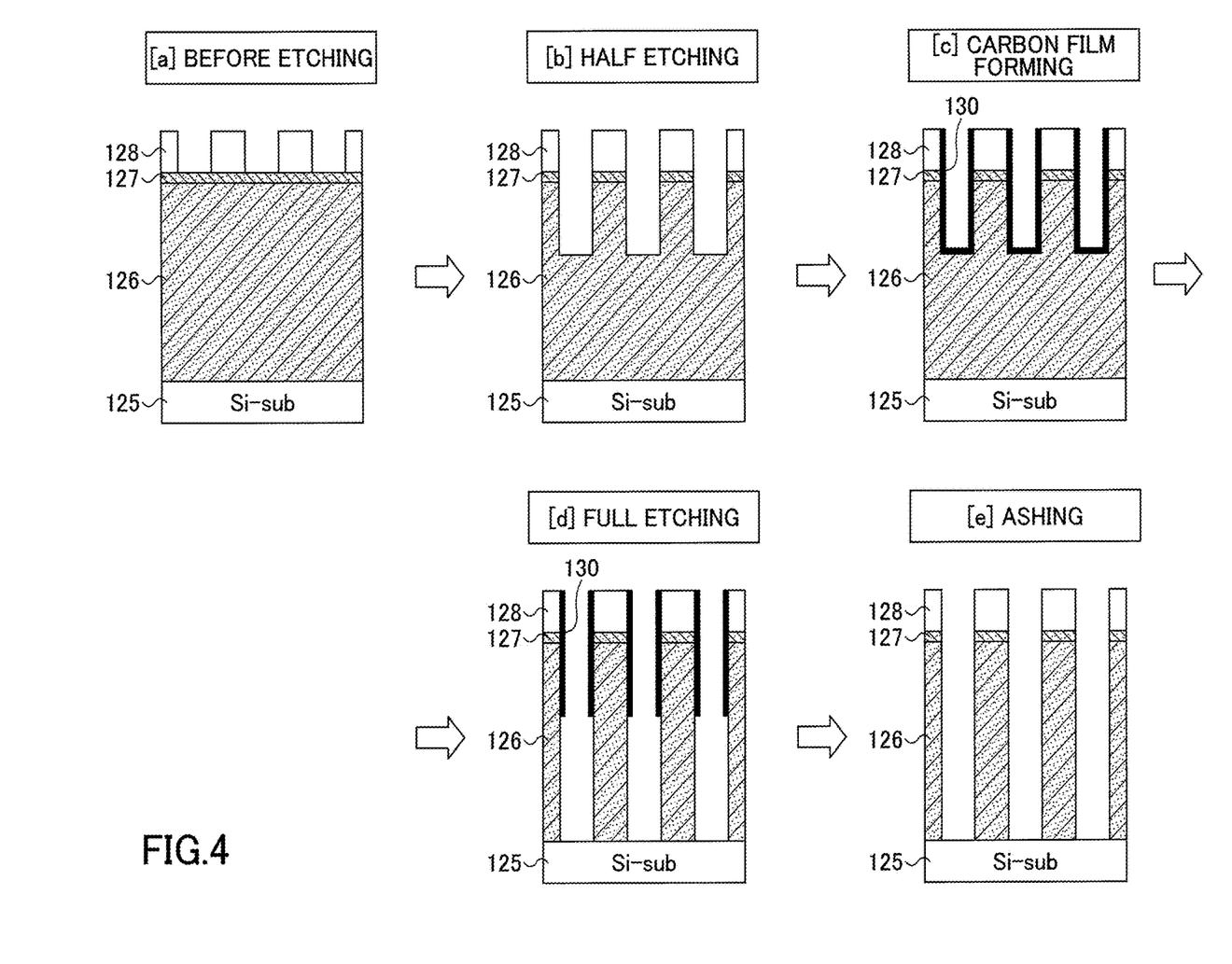
FIG. 4 is a diagram illustrating a substrate processing method.

FIG. 4 illustrates the substrate processing method of the present embodiment. FIG. 4(a) illustrates the silicon oxide film 126 formed on the silicon substrate 125 before being etched. The silicon oxide film 126, the silicon nitride film 127, and the polysilicon mask 128 are formed on the silicon substrate 125. Additionally, the polysilicon mask 128 may be the amorphous carbon mask, or the metal-containing mask. Also, the silicon nitride film 127 may not be included.

<Half Etching>

In the substrate processing method of the present embodiment, first, the silicon substrate 125 is carried into the PC1. The silicon nitride film 127 and the silicon oxide film 126 are etched in the PC1. As illustrated in FIG. 4(B), the silicon oxide film 126 is partway etched in the PC1 (first etching step: half etching). "partway etched" means not only that the silicon oxide film 126 is etched in a depth direction to approximately half depth but also that the silicon oxide film 126 is etched in a depth direction to an extent without forming the bowing shape.

An example etching process condition is that the pressure is 2.66 Pa, the frequency of the high frequency power HF is 60 MHz, the power thereof is 1200 W, and the gas is mixture of $C_4F_6$ gas, $C_4F_8$ gas, Ar gas, and $O_2$ gas.

<Carbon Film Forming>

Then, the silicon substrate 125 is carried from the PC1 to the PC2. As illustrated in FIG. 4(c), the carbon film 130 is formed on the etched silicon oxide film 126 in the PC2. Thus, the carbon film 130 is uniformly formed on the inner wall of the pattern formed on the silicon oxide film 126 (film forming step). Additionally, the film formed on the silicon oxide film 126 may not be carbon film 130 but a film including carbon.

An example process condition of the carbon film forming is that the pressure is 997 Pa, the temperature is 400° C., and the gas is mixture of $C_2H_4$ gas and $Cl_2$ gas.

Figure 5:
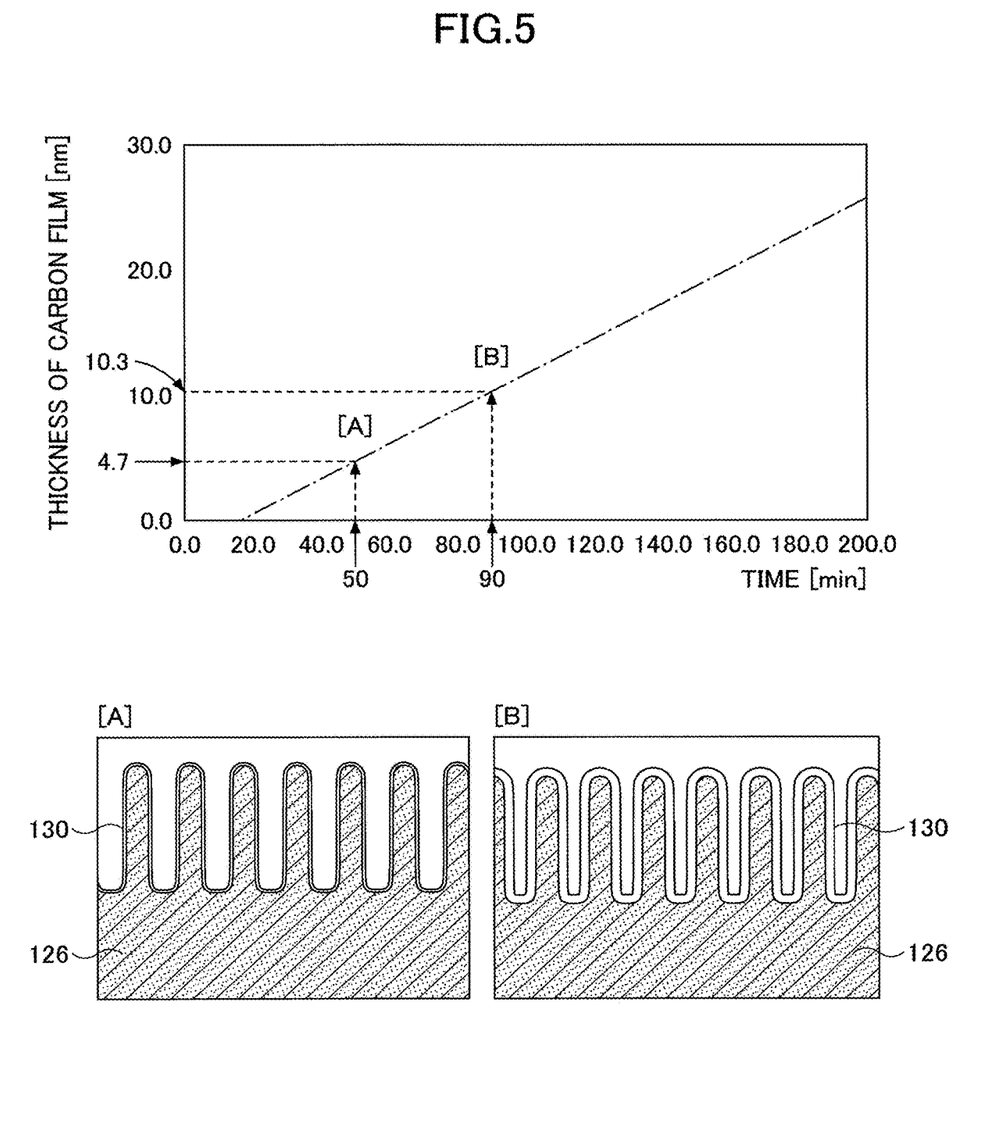
FIG. 5 is a diagram illustrating examples of carbon film.

FIG. 5 is a diagram illustrating examples of carbon films formed by the thermal CVD apparatus used as the PC2 of the present embodiment. According to a graph illustrated in FIG. 5, a thickness of the carbon film 130 illustrated in FIG. 5(A) becomes 4.7 nm at film forming time 50 min., while a thickness of the carbon film 130 illustrated in FIG. 5(B) becomes 10.3 nm at film forming time 90 min. Regarding both carbon films 130 formed on the silicon oxide films 126 illustrated in FIG. 5(A) and FIG. 5(B), the carbon film 130 with uniform thickness is formed on side walls and bottom walls of the etching pattern formed on the silicon oxide film 126.

According to a relationship between the film forming time and the thickness of the carbon film illustrated in the graph of FIG. 5, 30 min. of the film forming time is required to form the carbon film 130 of the present embodiment because a required thickness of the carbon film 130 is 1 nm-2 nm.

Additionally, it is conceivable that the film forming step illustrated in FIG. 4(c) may be performed in-situ in the PC1. However, the uniformity of thickness of the carbon film 130 is important when the carbon film 130 whose thickness is 1 nm-2 nm is formed.

On the other hand, in a case where the carbon film 130 is formed by using plasma in the PC1, the carbon film 130 becomes thinner at bottom side of the etching pattern than at upper side thereof because the ion is unlikely to enter into the bottom side of the etching pattern, and the like. Accordingly, it is difficult to form the carbon film 130 with uniform thickness on the silicon oxide film 126. Hence, it is preferable that the film forming step of FIG. 4(c) is performed in non-plasma environment (without using plasma) to form the carbon film 130.

<Full Etching>

Referring back to FIG. 4(c), the silicon substrate 125 is carried from the PC2 to the PC1 after forming the film. As illustrated in FIG. 4(d), the silicon oxide film 126 is further etched in the PC1 (second etching step: full etching). In the full etching, the carbon film 130 serves as a protection film formed on the side wall of the silicon oxide film 126, thereby suppressing formation of the bowing shape in the etching pattern.

The process condition of the etching in FIG. 4(d) may be the same as that in FIG. 4(b). The process condition of the etching in FIG. 4(d) may be different from that in FIG. 4(b) as long as a gas including fluorocarbon is supplied into the PC1.

In the second etching step, in the PC1, the etching of the silicon oxide film 126 may be finished when the silicon oxide film 126 is fully etched and the silicon substrate 125, which is a ground layer, is exposed. The etching of the silicon oxide film 126 may be finished when a combination of the second etching step (FIG. 4(d)) and the film forming step (FIG. 4(c)) are performed in the PC1 and the PC2 a predetermined times repeatedly.

<Ashing>

Then, as illustrated in FIG. 4(e), the ashing process is performed in the PC1 after the second etching step, thereby removing the carbon film 130 (second ashing step). In the ashing, oxygen plasma generated from oxygen gas may be used.

Hereinabove, the substrate processing method using the substrate processing system 1 is described. In the following, an example effect of the substrate processing method of the present embodiment will be described with reference to FIG. 6.

<Example Effect>

Figure 6:
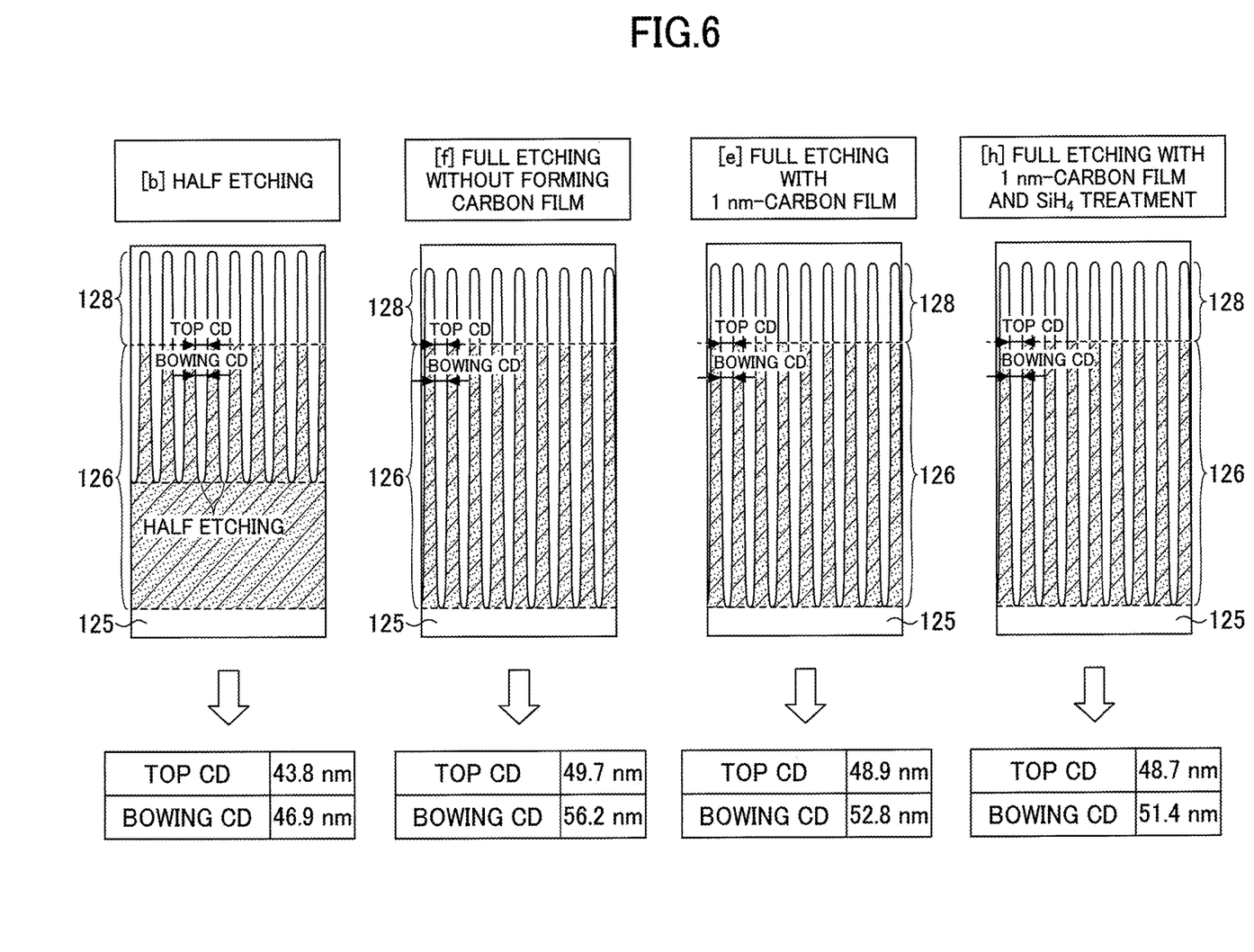
FIG. 6 is a diagram illustrating an example effect of the substrate processing method.

FIG. 6 is a diagram illustrating an example effect of the substrate processing method of the present embodiment. FIG. 6(b) is a diagram illustrating the pattern after the half etching (FIG. 4(b)). FIG. 6(f) is a diagram illustrating the pattern after the full etching without forming the carbon film. FIG. 6(e) is a diagram illustrating the pattern after the full etching (FIG. 4(d)) with the carbon film whose thickness is 1 nm. FIG. 6(h) is a diagram illustrating the pattern after the full etching, where the full etching is performed after forming the carbon film whose thickness is 1 nm and further performing treatment with monosilane ($SiH_4$). Additionally, FIG. 6 illustrates the example in a case where the silicon nitride film 127 is not laminated.

In the pattern after the half etching illustrated in FIG. 6(b), the top CD is 43.8 nm and the bowing CD is 46.9 nm.

In the pattern after the full etching without forming the carbon film illustrated in FIG. 6(f), the top CD is 49.7 nm and the bowing CD is 56.2 nm. In the pattern after full etching with 1 nm-carbon film illustrated in FIG. 6(e), the top CD is 48.9 nm and the bowing CD is 52.8 nm.

In the pattern after full etching with 1 nm-carbon film and monosilane ($SiH_4$) treatment illustrated in FIG. 6(h), the top CD is 48.7 nm and the bowing CD is 51.4 nm.

As described above, the bowing CD is improved in a case where the carbon film is formed than a case where the carbon film is not formed. That is, when the carbon film is formed during the etching, the carbon film serves as the protection film to suppress the bowing shape formed in the etching.

Moreover, the bowing CD is further improved in a case where treatment with monosilane ($SiH_4$) is performed after than a case where the carbon film is not formed and a case where the carbon film whose thickness is 1 nm is formed. It is conceived that the film including silicon formed on the carbon film serves as the protection film as well as the carbon film to suppress the bowing shape.

Additionally, in the treatment after forming the carbon film, a single gas of monosilane ($SiH_4$) or mixture of monosilane gas and dilution gas ($N_2$ gas, $H_2$ gas, etc.) may be used.

As described above, according to the substrate processing method of the present embodiment, by performing a carbon film forming step during the etching step, the silicon oxide film 126 is protected by the carbon film 130 in the remaining etching step to suppress the bowing shape. Consequently, the etching shape can be vertical and favorable device characteristics can be obtained.

<Variation 1>

Figure 7:
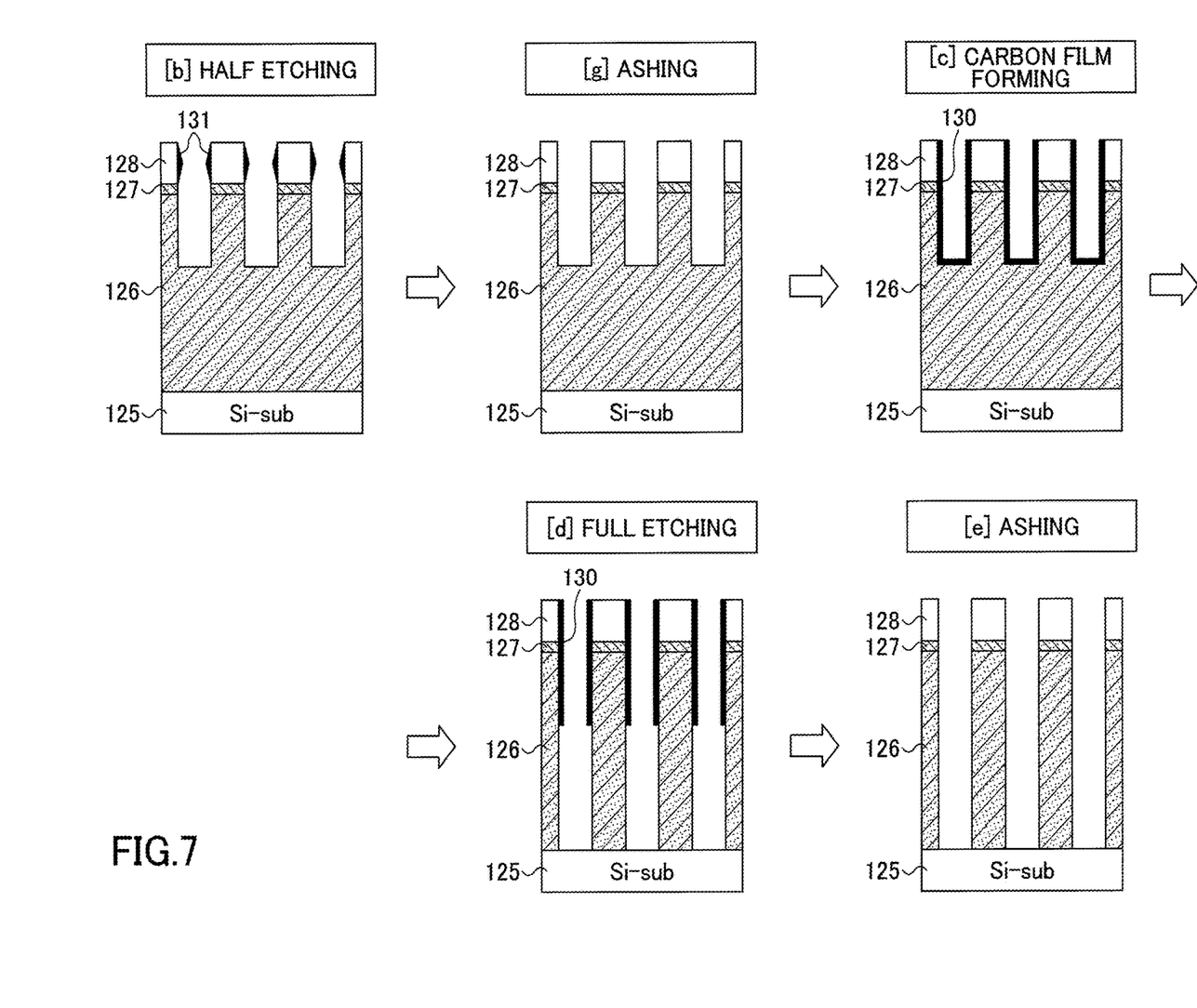
FIG. 7 is a diagram illustrating a substrate processing method of variation 1.
Figure 8:
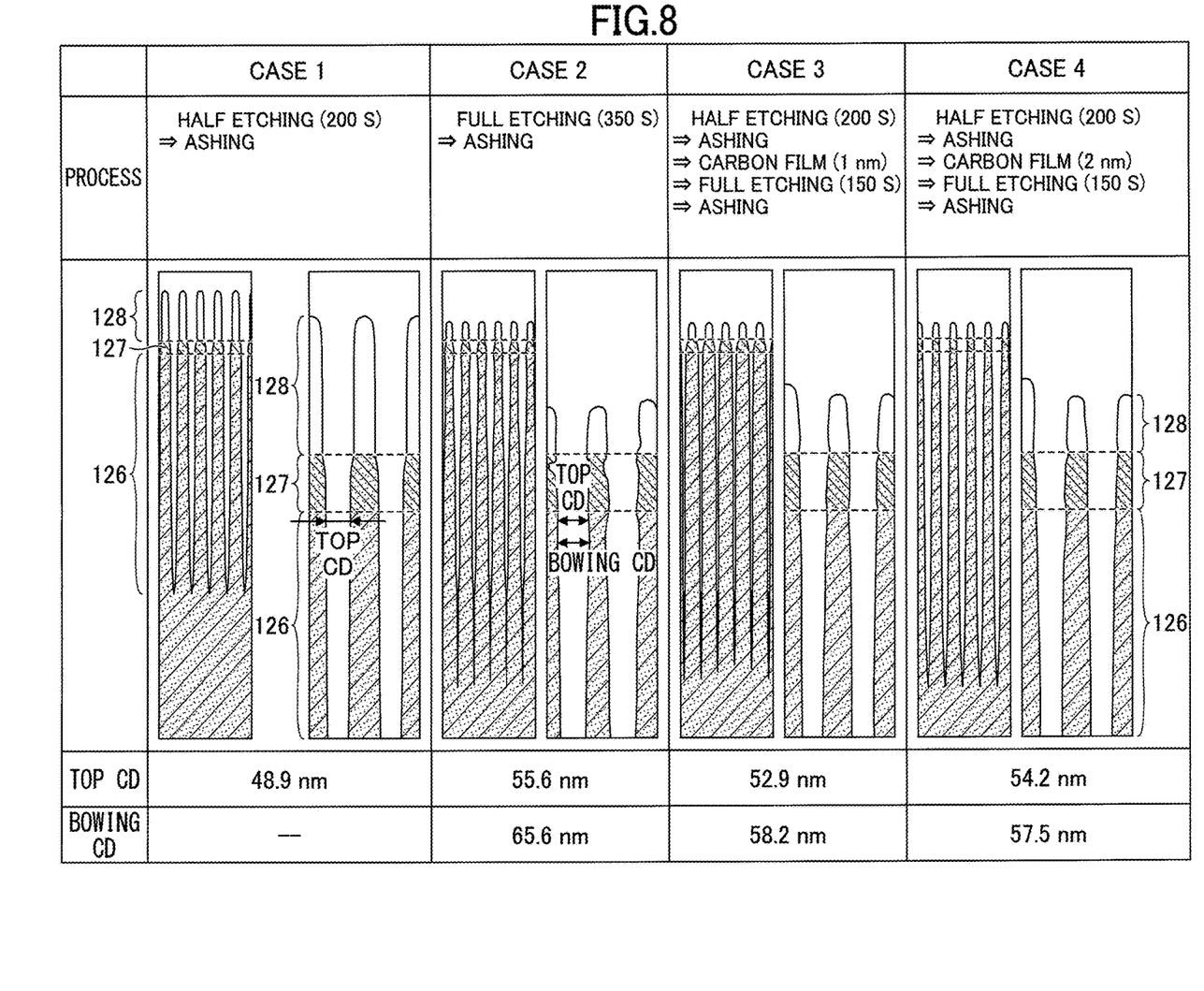
FIG. 8 is a diagram illustrating an example effect of the substrate processing method of variation 1.

In the following a substrate processing method of variation 1 will be described with reference to FIG. 7 and FIG. 8. FIG. 7 is a diagram illustrating the substrate processing method of variation 1. FIG. 8 is a diagram illustrating an example effect of the substrate processing method of variation 1.

The substrate processing method of variation 1 illustrated in FIG. 7 is different from the substrate processing method illustrated in FIG. 4 in that an ashing step illustrated in FIG. 7(g) is inserted between the half etching step illustrated in FIG. 4(b) and FIG. 7(b) and the film forming step illustrated in FIG. 4(c) and FIG. 7(c).

As illustrated in FIG. 7(b), reaction product 131 of polymer generated through the etching is deposited on the polysilicon mask 128 after the half etching is performed on the silicon oxide film 126. Therefore, the film forming step illustrated in FIG. 7(c) is preferably performed after removing the deposited reaction product 131 in the ashing step illustrated in FIG. 7(g). In the ashing step (first ashing step) illustrated in FIG. 7(g) and in the ashing step (second ashing step) illustrated in FIG. 7(e), oxygen plasma generated from oxygen gas may be used.

In this way, the carbon film can be more uniformly formed by removing the reaction product 131 deposited on the polysilicon mask 128.

<Example Effect>

An example effect of the substrate processing method of variation 1 and an example effect of thickness of the carbon film will be described with reference to FIG. 8. Additionally, FIG. 8 illustrates examples in a case where the silicon nitride film 127 is laminated.

In "case 1" illustrated in a leftmost portion of FIG. 8, the pattern after the half etching (200 seconds) illustrated in FIG. 7(b) and further the ashing (first ashing step) illustrated in FIG. 7(g) is performed is illustrated.

In "case 2", the pattern after the full etching (350 seconds) without performing the half etching is performed and further the ashing is performed is illustrated.

In "case 3", the pattern is illustrated, where the pattern of "case 3" is formed through the half etching (200 seconds), the ashing, the carbon film (whose thickness is 1 nm) forming, the full etching (150 seconds), and the ashing.

In "case 4", the pattern is illustrated, where the pattern of "case 4" is formed through the half etching (200 seconds), the ashing, the carbon film (whose thickness is 2 nm) forming, the full etching (150 seconds), and the ashing.

The top CD is 55.6 nm in case 2, 52.9 nm in case 3, and 54.2 nm in case 4. The bowing CD is 65.6 nm in case 2, 58.2 nm in case 3, and 57.5 nm in case 4.

Thus, the bowing shape can be suppressed in a case where the carbon film 130 whose thickness is greater than or equal to 1 nm is formed than a case where the carbon film 130 is not formed.

Also, the bowing shape can be more certainly suppressed in a case where the carbon film 130 whose thickness is 2 nm is formed than a case where the carbon film 130 whose thickness is 1 nm is formed.

As described above, according to the substrate processing method of variation 1, by performing the ashing after the half etching, the reaction product 131 deposited on the polysilicon mask 128 can be removed. In this way, the carbon film can be more uniformly formed on the inner wall of the etching pattern in the film forming step after the ashing. Consequently, the bowing shape can be effectively suppressed in the remaining etching step.

<Variation 2>

Figure 9:
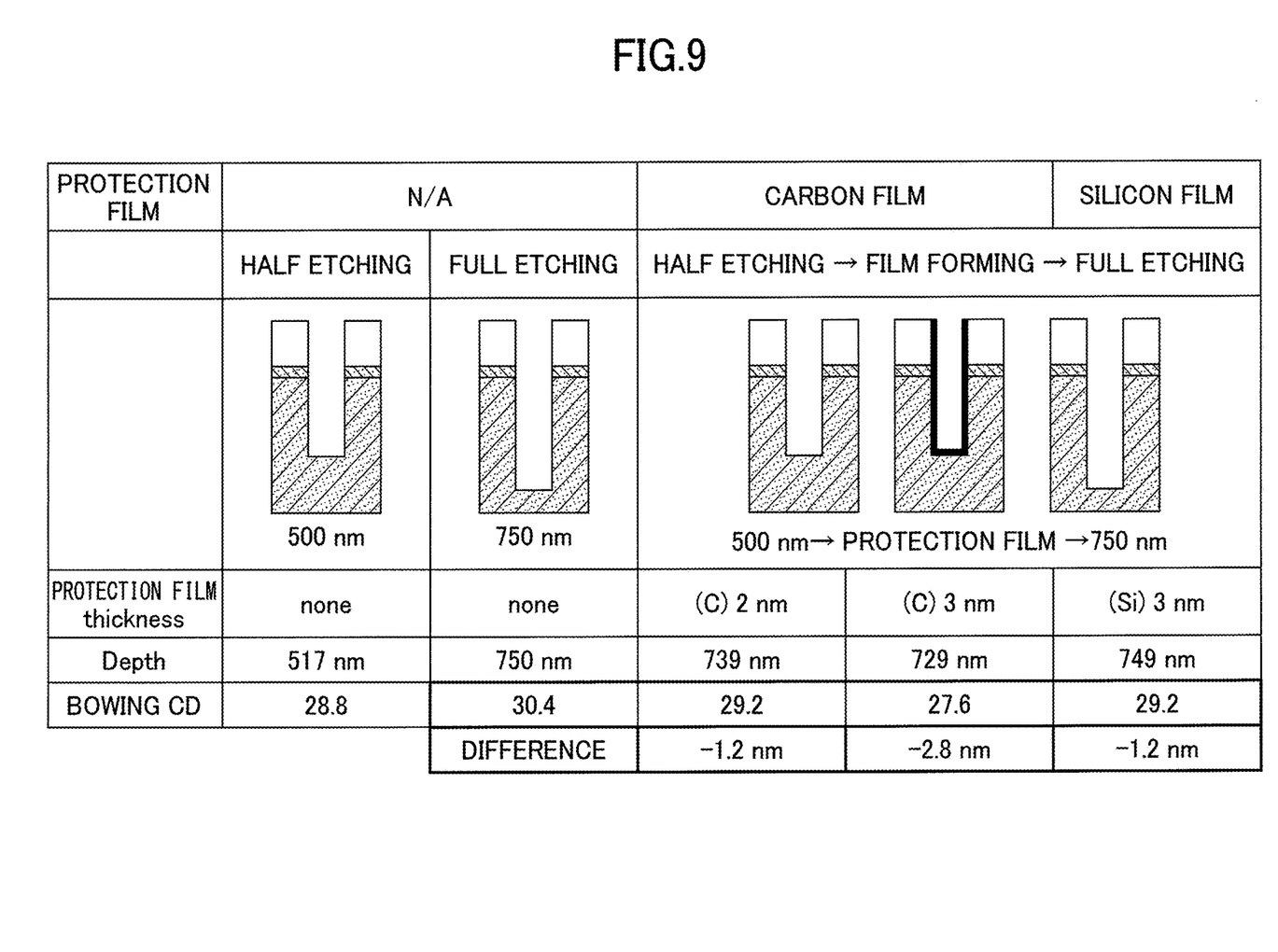
FIG. 9 is a diagram illustrating an example effect of a substrate processing method of variation 2.

In the following, the substrate processing method of variation 2 will be described with reference to FIG. 9. FIG. 9 is a diagram illustrating an example effect of the substrate processing method of variation 2. In the substrate processing methods of above-described embodiment and variation 1, the carbon film is formed as the protection film. On the other hand, in the substrate processing method of variation 2, a silicon film is formed instead of the carbon film.

Specifically, a silicon film forming step is performed instead of the carbon film forming step illustrated in FIG. 7(c) after the half etching step illustrated in FIG. 7(b) and the ashing step illustrated in FIG. 7(g) are sequentially performed. According to the step, the silicon film is formed as a protection film instead of the carbon film 130 illustrated in FIG. 7(c). Then, the full etching step illustrated in FIG. 7(d) is performed.

FIG. 9 is a diagram illustrating a result of the substrate processing method of variation 2. The bowing CD after the half etching in a case where the protection film is not formed, the bowing CD after the full etching in a case where the protection film is formed, and bowing CDs after the full etching in a case where the protection film is formed are described in a line before the last line of FIG. 9. As cases where the protection film is formed, cases where the carbon (C) films whose thickness are 2 nm and 3 nm are formed and a case where a silicon (Si) film whose thickness is 3 nm is formed are described. Also, in the last line of FIG. 9, differences between bowing CDs after the full etching in a case where the protection film is not formed and the bowing CDs after the full etching in a case where the protection film is formed are described.

Additionally, an example process condition of the silicon film forming is that the pressure is 133 Pa (1 Torr), the temperature is 380° C., the gas is a mixed gas containing $Si_2H_6/N_2$.

As described above, the bowing shape can be suppressed in a case where the carbon film or the silicon film is formed, as a protection film, after the half etching in comparison to a case where the full etching is performed without forming the protection film.

Also, according to the result illustrated in FIG. 9, the bowing shape is hardly formed in a case where the carbon film whose thickness is 3 nm is formed as the protection film after the half etching. Also, according to the result illustrated in FIG. 9, almost equal effect of suppression of the bowing shape can be obtained in a case where the carbon film whose thickness is 2 nm is formed as the protection film and in a case where the silicon film whose thickness is 3 nm is formed as the protection film.

As described above, the bowing shape can be suppressed both by the carbon film and by the silicon film. However, taking the throughput into account, the bowing shape can be more effectively suppressed by forming the carbon film as the protection film than forming the silicon film.

Additionally, although in the substrate processing method of variation 2, the silicon film is formed as the protection film instead of the carbon film, this is not a limiting example. For example, two or more laminated layers of the carbon film and the silicon film may be formed as the protection film. In this case, the carbon film may be formed prior to the silicon film, or the silicon film may be formed prior to the carbon film. Also, film forming processes for forming the laminated layer of the carbon film and the silicon film may be performed subsequently in the same chamber of the PC2 illustrated in FIG. 1, where the process condition such as the type of gas is changed.

Additionally, in variation 2, in the PC2, a treatment with a single gas of monosilane ($SiH_4$) or mixed gas containing monosilane may be also performed after the film forming step for forming the silicon film or mixture of the silicon film and the carbon film and before the full etching.

Herein above, although the substrate processing system and the substrate processing method have been described with respect to a above described embodiment for a complete and clear disclosure, the substrate processing system and the substrate processing method are not to be thus limited but are to be construed as embodying all modifications and alternative constructions within a range of the present invention.

Also, the substrate processing system may process various types of substrates such as a wafer, a large substrate used for a FPD (Flat Panel Display) and a substrate used for EL element or solar battery.

REFERENCE SIGNS LIST

1: substrate processing system
2: conveyance mechanism
12: mounting table
14: high frequency power supply
16: shower head
22: outer wall
24: inner wall
30: processing chamber
40: control unit
42: storage unit
52: conveyance apparatus
125: silicon substrate
126: silicon oxide film
127: silicon nitride film
128: polysilicon mask
130: carbon film
131: reaction product
PC1 and PC2: process chambers
TC: transfer chamber
T: top CD
B: bowing CD

What is claimed is:

1. A processing apparatus for processing a substrate, comprising:
   a first chamber having a first gas inlet;
   a plasma generator that generates a plasma in the first chamber to process a substrate;
   a second chamber having a second gas inlet;
   a user interface configured to receive an inputted instruction;
   a control unit; and
   a memory that includes control programs that are executed by the control unit in response to the inputted instruction to:
      (a) control the first gas inlet to provide a carbon containing gas to the first chamber and control the plasma generator to apply a first plasma to a silicon-containing film of the substrate to a first depth so as to form a recess in the silicon-containing film, said silicon-containing film including a silicon oxide film;
      (b) control the first gas inlet to stop application of the carbon containing gas and cease operation of the plasma generator after the recess is at least partially formed and a first part of a protection film is formed on a side wall of the recess, the first part of the protection film having a thickness range in a range of 1 to 3 nm, and a first thickness at an upper portion of the recess and a second thickness at a lower portion of the recess, the second thickness being smaller than the first thickness;
      control a transfer of the substrate from the first chamber to the second chamber;
      control the second gas inlet to apply another gas inside the second chamber and deposit a second part of the protection film over the first part of the protection film;
      control another transfer of the substrate from the second chamber to the first chamber; and
      (c) control a supply of a fluorocarbon gas through the first gas inlet and control the plasma generator to generate a second plasma to etch the silicon-containing film to a second depth, the second depth being greater than the first depth, while the protection film inhibits the side wall of the recess from being further etched by the second plasma.

2. The processing apparatus according to claim 1, wherein the another gas is a silicon containing gas, and the second part of the protection film is a silicon-containing film is formed as a silicon-containing oxide film, a silicon nitride film, or a stacked film of the silicon-containing oxide film and the silicon nitride film.

3. The processing apparatus according to claim 1, wherein the protection film contains silicon or carbon.

4. The processing apparatus according to claim 1, wherein the first part of the protection film is a carbon film and the second part of the protection film is a silicon-containing film.

5. The processing apparatus according to claim 1, wherein the control executed by the control unit to have the second gas enter into the second chamber causes formation of a silicon-containing film of substantially uniform thickness as the second part of the protection film.

6. The processing apparatus according to claim 1, wherein the control unit executes the control programs to control the plasma generator to apply the first plasma for a period of time that stops before the recess develops a bowing shape in the side wall.

7. The processing apparatus according to claim 6, wherein the another gas is a silicon containing gas, and the second part of the protection film is a silicon-containing film is formed of a silicon-containing oxide film, a silicon nitride film, or a stacked film of the silicon-containing oxide film and the silicon nitride film.

8. The processing apparatus according to claim 6, wherein the control executed by the control unit to enter the another gas into the second chamber initially causes formation of a silicon-containing film of substantially uniform thickness as the second part of the protection film.

9. The processing apparatus according to claim 6, wherein the control unit executes the control programs to control a cycle of (b) and (c) to be repeated multiple times.

10. The processing apparatus according to claim 6, further comprising: a shower head configured to supply an etching gas into the first chamber.

11. The processing apparatus according to claim 6, further comprising: a shower head configured to supply a gas containing fluorocarbon into the first chamber.

12. The processing apparatus according to claim 6, further comprising: a shower head configured to supply a gas containing carbon into the first chamber.

13. The processing apparatus according to claim 6, further comprising: a shower head configured to supply a gas containing silicon into the first chamber.

14. The processing apparatus according to claim 1, wherein the control unit executes the control programs to control a cycle of (b) and (c) to be repeated multiple times.

15. The processing apparatus according to claim 1, further comprising: a shower head configured to supply an etching gas into the first chamber.

16. The processing apparatus according to claim 1, further comprising: a shower head configured to supply a gas containing fluorocarbon into the first chamber.

17. The processing apparatus according to claim 1, further comprising: a shower head configured to supply a gas containing carbon into the first chamber.

18. The processing apparatus according to claim 1, further comprising: a shower head configured to supply a gas containing silicon into the first chamber.

19. The processing apparatus according to claim 1, wherein the control unit executes the control programs to perform (a), (b) and (c) with a polysilicon mask, an amorphous carbon mask, or a metal-containing mask provided on the silicon-containing film.

20. The processing apparatus according to claim 1, wherein the carbon containing gas is $C_2H_4$.

* * * * *